US009455336B2

(12) United States Patent
Cheng et al.

(10) Patent No.: US 9,455,336 B2
(45) Date of Patent: Sep. 27, 2016

(54) SIGE AND SI FINFET STRUCTURES AND METHODS FOR MAKING THE SAME

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/920,926

(22) Filed: Oct. 23, 2015

(65) Prior Publication Data

US 2016/0043087 A1    Feb. 11, 2016

Related U.S. Application Data

(62) Division of application No. 14/176,575, filed on Feb. 10, 2014.

(51) Int. Cl.
*H01L 29/78* (2006.01)
*H01L 29/66* (2006.01)
(Continued)

(52) U.S. Cl.
CPC ... *H01L 29/66818* (2013.01); *H01L 21/02532* (2013.01); *H01L 21/3083* (2013.01); *H01L 21/823807* (2013.01); *H01L 21/823821* (2013.01); *H01L 27/0922* (2013.01); *H01L 27/0924* (2013.01); *H01L 29/1033* (2013.01); *H01L 29/16* (2013.01); *H01L 29/161* (2013.01)

(58) Field of Classification Search
CPC ............... H01L 29/66795–29/66818; H01L 29/785–29/7856; H01L 21/823831; H01L 21/823821; H01L 21/845; H01L 27/0886; H01L 27/0924; H01L 27/1211; H01L 21/02532; H01L 21/823807; H01L 27/0922; H01L 29/16; H01L 29/161
See application file for complete search history.

(56) References Cited

U.S. PATENT DOCUMENTS 7,304,336 B2 * 12/2007 Cheng ............... H01L 29/66795
257/288
7,851,340 B2    12/2010 Brownson et al.
(Continued)

OTHER PUBLICATIONS

Disclosed Anonymously, "Method and System for Fabricating a High-k/metal Gate finFET CMOS by Simultaneously Forming Si-nFET and SiGe-pFET on a Semiconductor Substrate", An IP.com Prior Art Database Technical Disclosure, IP.com No. IPCOM000217323D, IP.com Electronic Publication: May 7, 2012, 6 pages.
(Continued)

*Primary Examiner* — Eric Ward
(74) *Attorney, Agent, or Firm* — L. Jeffrey Kelly; Steven Meyers

(57) ABSTRACT

FinFET structures and methods for making the same. A method includes: creating a plurality of Silicon fins on a first region of a substrate, creating a plurality of Silicon-Germanium fins on a second region of the substrate, adjusting a Silicon fin pitch of the plurality of Silicon fins to a predetermined value, and adjusting a Silicon-Germanium fin pitch of the plurality of Silicon-Germanium fins to a predetermined value, where the creating steps are performed in a manner that Silicon material and Silicon-Germanium material used in making the plurality of fins will be on the semiconductor structure at a same time.

17 Claims, 14 Drawing Sheets

(51) Int. Cl.
*H01L 27/092* (2006.01)
*H01L 29/16* (2006.01)
*H01L 29/161* (2006.01)
*H01L 21/8238* (2006.01)
*H01L 29/10* (2006.01)
*H01L 21/02* (2006.01)
*H01L 21/308* (2006.01)

(56) References Cited

U.S. PATENT DOCUMENTS

| | | |
|---|---|---|
| 8,021,949 B2 | 9/2011 | Cheng et al. |
| 8,053,301 B2 | 11/2011 | Jaeger et al. |
| 8,211,772 B2 | 7/2012 | Kavalieros et al. |
| 8,399,938 B2 | 3/2013 | Cheng et al. |
| 8,420,471 B2 | 4/2013 | Anderson et al. |
| 8,822,284 B2 | 9/2014 | Lin et al. |
| 9,006,842 B2 | 4/2015 | Colinge et al. |
| 2005/0236668 A1* | 10/2005 | Zhu .................. H01L 21/28035 257/347 |
| 2012/0196412 A1 | 8/2012 | Chen et al. |
| 2012/0276695 A1 | 11/2012 | Cheng et al. |
| 2013/0221491 A1* | 8/2013 | Wann ............... H01L 21/823431 257/618 |
| 2013/0224936 A1* | 8/2013 | Lee ................. H01L 21/823821 438/492 |
| 2013/0244392 A1 | 9/2013 | Oh et al. |
| 2013/0313619 A1* | 11/2013 | Fumitake ............... H01L 21/845 257/288 |
| 2013/0334614 A1* | 12/2013 | Liaw ............... H01L 21/823821 257/401 |
| 2014/0054650 A1 | 2/2014 | Colinge |
| 2015/0102385 A1* | 4/2015 | Fung ................. H01L 21/02381 257/190 |
| 2015/0144999 A1* | 5/2015 | Ching ............... H01L 29/66795 257/190 |
| 2015/0228653 A1 | 8/2015 | Cheng et al. |
| 2015/0263003 A1 | 9/2015 | Lee et al. |

OTHER PUBLICATIONS

Pending U.S. Appl. No. 15/002,431, filed Jan. 21, 2016, entitled: "SiGe and Si FinFET Structures and Methods for Making the Same", 34 pages.

* cited by examiner

SIGE AND SI FINFET STRUCTURES AND METHODS FOR MAKING THE SAME

BACKGROUND

The present application relates to a semiconductor structure and a method of forming the same. More particularly, the present application relates to a FinFET device and a method for making the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of CMOS devices. FinFETs are non-planar semiconductor devices which include at least one semiconductor fin protruding from a surface of a substrate. A gate dielectric can be formed in direct physical contact with each vertical sidewall of the at least one semiconductor fin and, optionally, in direct physical contact with a topmost surface of the semiconductor fin. A gate conductor can be formed on the gate dielectric and straddling a portion of the at least one semiconductor fin. FinFETs can increase the on-current per unit area relative to planar field effect transistors.

As such, there is a need to improve FinFET devices and methods for making the same.

SUMMARY

One aspect of the invention includes a FinFET structure. The FinFET structure includes: a first region on a substrate, a second region on the substrate, a plurality of Silicon fins, with a same Silicon fin pitch, on the first region of the substrate, and a plurality of Silicon-Germanium fins, with a same Silicon-Germanium fin pitch, on the second region of the substrate, where the Silicon-Germanium fins are tall and have a high Germanium concentration.

Another aspect of the invention includes a method for making a FinFET structure. The method includes: creating a plurality of Silicon fins on a first region of a substrate, creating a plurality of Silicon-Germanium fins on a second region of the substrate, adjusting a Silicon fin pitch of the plurality of Silicon fins to a predetermined value, and adjusting a Silicon-Germanium fin pitch of the plurality of Silicon-Germanium fins to a predetermined value, where the Silicon-Germanium fins are tall and have a high Germanium concentration.

Yet another aspect of the invention includes a method for making a FinFET structure. The method includes: creating a plurality of Silicon fins on a first region of a substrate, creating a plurality of Silicon-Germanium fins on a second region of the substrate, adjusting a Silicon fin pitch of the plurality of Silicon fins to a predetermined value, and adjusting a Silicon-Germanium fin pitch of the plurality of Silicon-Germanium fins to a predetermined value, where the creating steps are performed in a manner that Silicon material and Silicon-Germanium material used in making the plurality of fins will be on the semiconductor structure at a same time.

Yet another aspect of the invention includes a structure that can be used to make a FinFET device. The structure includes: a first region on a substrate, a second region on the substrate, and Silicon-Germanium and Silicon material located in both the first and second region, where the Silicon-Germanium and Silicon material is segmented such that spacing between each segment is the same.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
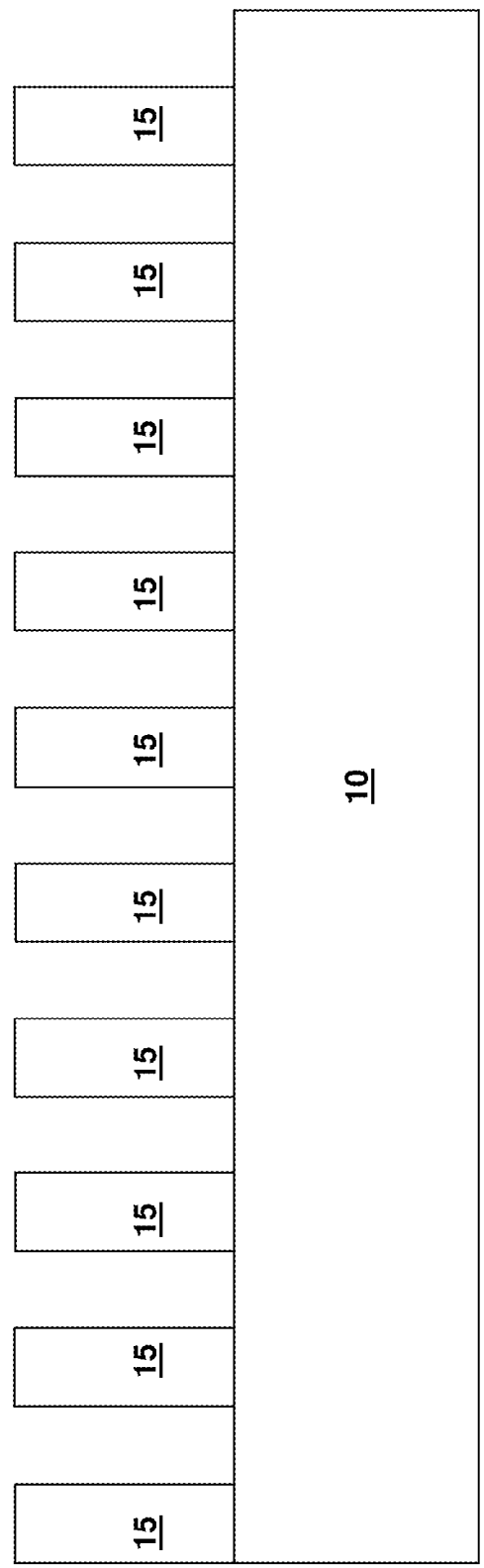
FIG. 1 illustrates an initial semiconductor structure that can be used to implement aspects of the present disclosure.

The present application will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

The various embodiments of the disclosure describe a structure and method for permitting the formation of at least two regions on a device, such as an n-FET and p-FET region on a semiconductor device, where one of the n-FET and p-FET regions can have a plurality of fins composed of Silicon-Germanium, and the other can have a plurality of fins composed of Silicon. The Silicon and Silicon-Germanium material can be laid down and formed into a plurality of fins, where each of the Silicon and Silicon-Germanium material is associated with a respective region, on a bulk substrate with a minimal number of process steps. Furthermore, the method and structure are beneficial for a variety of fin dimensions, but are particularly beneficial for devices with fins that are 12 nm or less in thickness and/or have fin pitch equal to or less than 24 nm. For example, 10 nm in thickness and a 20 nm fin pitch. Furthermore, with respect to the Silicon-Germanium fins, several embodiments of the present disclosure facilitate the ability to create Silicon-Germanium fins that are less than or equal to 12 nm in width, greater than or equal to 50 nm in height, and with a Germanium concentration greater than or equal to 25% Germanium. Additionally, the method and structure make it possible for each of the p-FET region fins to have an equal spacing and fin pitch between and among themselves, and the same for each of the n-FET region fins; however, the fin pitch and fin spacing of the n-FET fins and p-FET fins can be different.

Referring first to FIG. 1, there is illustrated a device, which includes from top to bottom, a bulk Silicon substrate 10 and a plurality of fins 15 dispersed thereon. The plurality of fins can be made of Silicon or an equivalent material. In some embodiments of the present application, the bulk substrate 10 can be a semiconductor material, where the term "semiconductor" as used herein in connection with the semiconductor material of the bulk substrate 10 denotes any semiconducting material including, for example, Si, Ge, Silicon-Germanium, SiC, Silicon-Germanium-carbon, InAs, GaAs, InP or other like III/V compound semiconductors. Multilayers of these semiconductor materials can also be used. In one embodiment, the bulk substrate 10 is silicon.

In some embodiments, the bulk substrate 10 can have the crystal orientation of {100}, {110}, or {111}. Other crystallographic orientations besides those specifically mentioned can also be used in the present application. The bulk substrate 10 can be a single crystalline semiconductor material, a polycrystalline material, or an amorphous material. In some embodiments, the bulk substrate 10 can be processed to include semiconductor regions having different crystal orientations.

As stated, the bulk Silicon substrate 10 can be any of the materials outlined above, and other equivalents. In one embodiment, as shown in FIG. 1, a bulk Silicon wafer is used to form both of the bulk Silicon substrate 10 and the plurality of fins 15. The methods and steps to create a bulk Silicon substrate 10 and a plurality of fins 15 from a bulk silicon wafer are known in the art and will not be delved into great detail herein.

Figure 2:
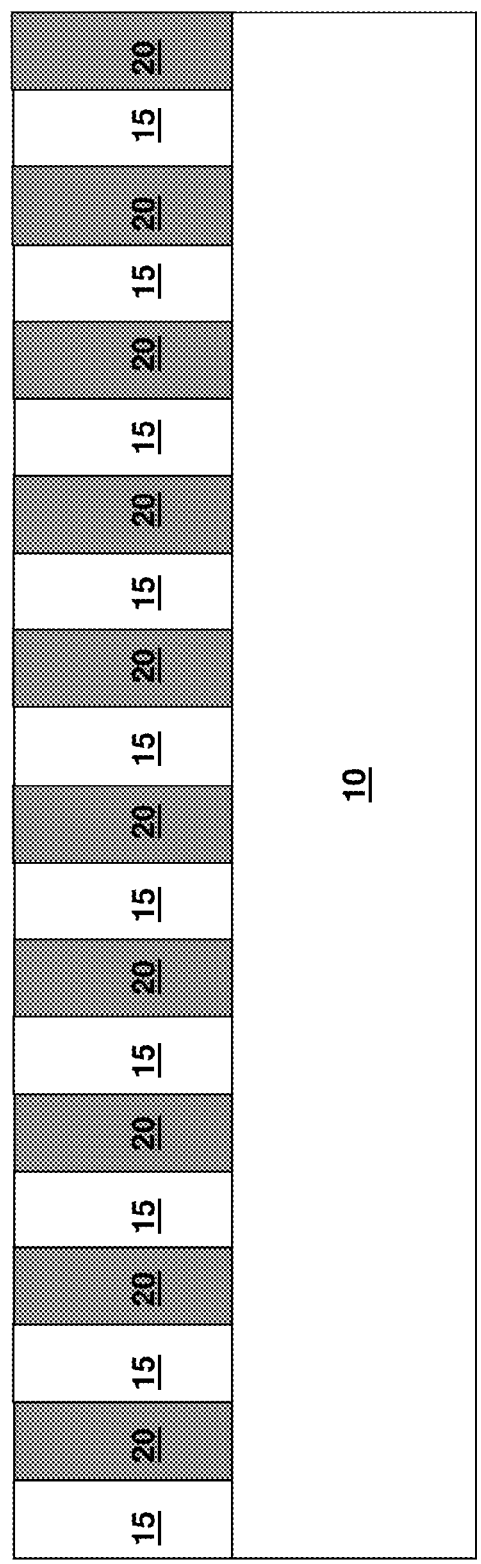
FIG. 2 illustrates a semiconductor structure in accordance with an embodiment of the present invention.

Referring to FIG. 2, Silicon-Germanium material 20 fills the spaces in between the plurality of the Silicon fins. The fill-in can happen by epitaxially growing the Silicon-Germanium from the bottom up. Generally, epitaxial growth, grown, deposition, formation, process etc. means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects and film cracking.

Additional steps will be described for portions of the bulk substrate 10 designated an n-FET region and as a p-FET region. As already stated and implied, these steps do not need to be done in any particular order; for example, those associated with the n-FET region can be done first and those associated with the p-FET region can be done second, and visa-versa. Since the bulk Silicon and Silicon-Germanium material necessary to form the respective fins for each region is on the same device at the same time, the thinning steps outlined in below (shown in FIG. 4 and FIG. 6) can be done at the same time, even though the individual thinning or etch rate and the actual trimmed/thinned amount can vary between the regions. It should be noted that the Silicon material which forms the plurality of fins 15 and the material that will form a plurality of Silicon-Germanium fins 20 (discussed below) can be on the bulk substrate 10 at the same time. It should be further stated the Germanium concentration of any one of the Silicon-Germanium fins 20 can be varied by epitaxial growth conditions and process gas flow, and the concentration can be 10%-80% Germanium.

The spacing in between the plurality of Silicon fins 15 can be the same, and by extension the fin pitch associated with the plurality of Silicon fins 15 will also be the same. This will also ensure that the spacing between Silicon fins 15 and Silicon Germanium fins 20 can be the same since the Silicon-Germanium material that will form the Silicon-Germanium fins 20 will be deposited in those equally spaced spaces. The equal spacing can be accomplished by sidewall image transfer and other known techniques in the art when the Silicon fins 15 are formed on the bulk substrate 10.

Figure 3:
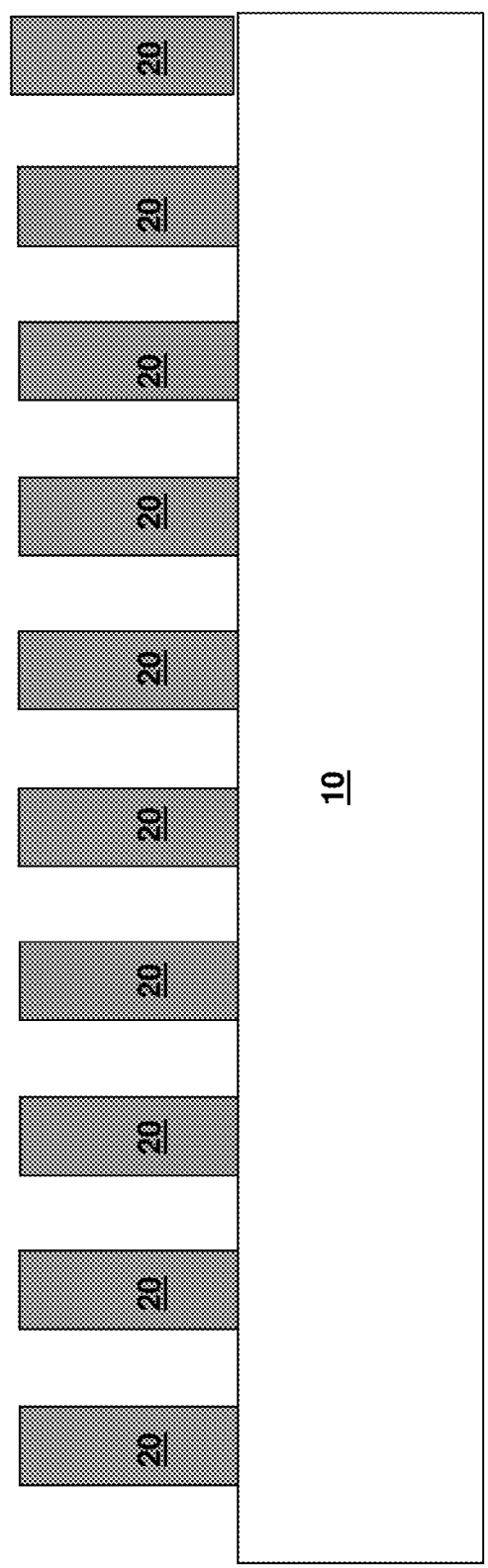
FIG. 3 illustrates a semiconductor structure in accordance with an embodiment of the present invention.

Accordingly, FIG. 3 shows additional process steps with respect to the p-FET region of the bulk substrate 10. The material that is the plurality of Silicon fins 15 is removed. The removal can be done by an etch process, such as a selective etch process, which removes the Silicon fins 15 but not the material that can form the Silicon-Germanium fins 20. An example of an etchant that can enable this process is Ammonia. The result will be that the Silicon-Germanium material 20 will be a plurality of Silicon-Germanium fins 20. Since the plurality of Silicon fins 15, and by extension the material forming the same, were formed in a manner such that they had a same fin pitch and fin spacing between them, the plurality of Silicon-Germanium fins 20 will also have a same fin pitch and fin spacing.

Figure 4:
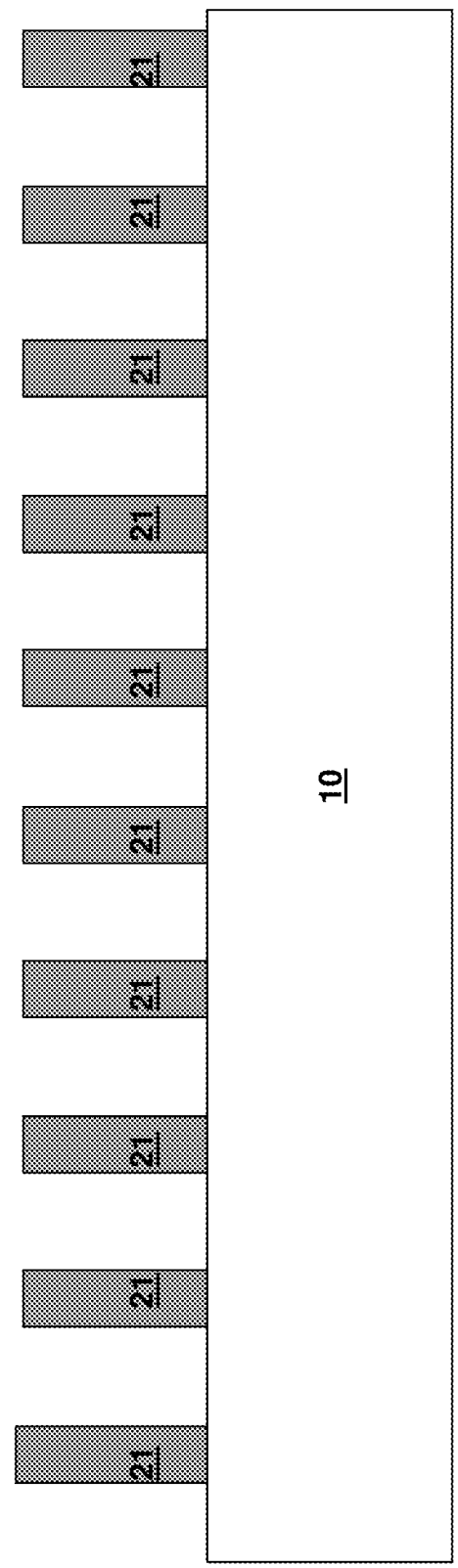
FIG. 4 illustrates a semiconductor structure in accordance with an embodiment of the present invention.

FIG. 4 shows another embodiment of the present disclosure, where any one of the plurality of Silicon-Germanium fins 20 can be thinned by a fin trimming process, such as for example, thermal oxidation followed by an etch employing hydro-fluoric acid, or an etch employing hydrochloric acid in an epitaxial reactor, resulting in thinner Silicon-Germanium fins 21.

Figure 5:
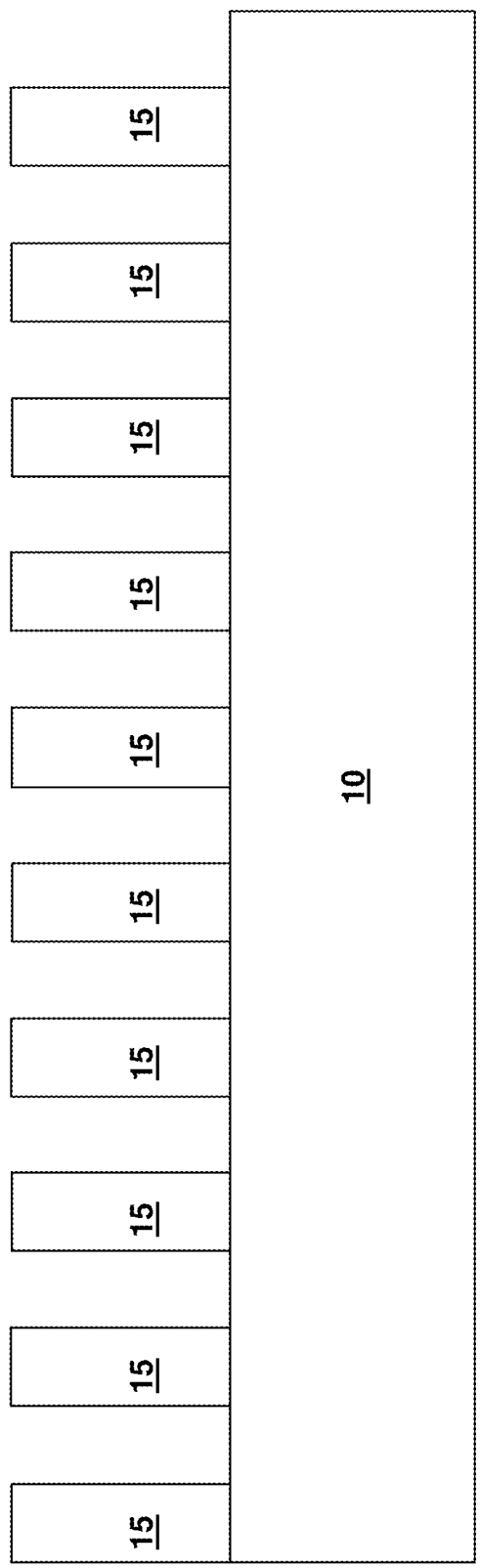
FIG. 5 illustrates a semiconductor structure in accordance with an embodiment of the present invention.

Referring to FIG. 5, additional process steps with respect to the n-FET region of the bulk substrate 10 are shown. The Silicon-Germanium material 20 is removed. The removal can be done by a selective etch process, which removes the Silicon-Germanium material that can form the Silicon-Germanium fins 20 but not the Silicon fins 15 and the material forming the same. One example for an etchant that can used for this process is TMAH (Tetramethylammonium hydroxide). The result will be that the plurality of Silicon fins 15 will remain for the n-FET region. Since the plurality of Silicon fins 15, and by extension the material forming the same, were formed in a manner such that they had a same fin pitch and fin spacing between them, after the Silicon-Germanium material 20 is removed, the plurality of Silicon fins 15 will retain a same fin spacing and fin pitch between them.

Figure 6:
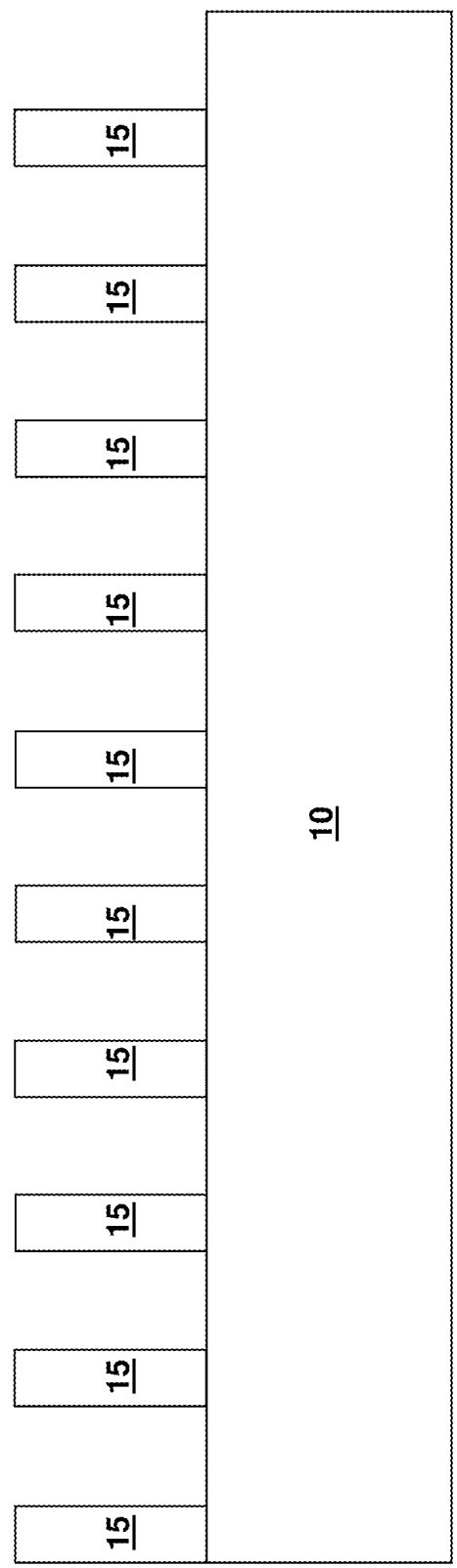
FIG. 6 illustrates a semiconductor structure in accordance with an embodiment of the present invention.

FIG. 6 shows another embodiment of the present disclosure, where any one of the plurality of Silicon fins 15 can be thinned by a fin trimming process, such as, for example, oxidation followed by an etch employing hydro-fluoric acid, or etching using gaseous hydrochloric acid in an epitaxial reactor.

As stated, the thinning steps shown in FIG. 4 and FIG. 6 can be performed at the same time for the separate portions of the device, i.e. the plurality of Silicon fins 15 in the n-FET region and the plurality of Silicon-Germanium fins 20 in the p-FET region.

It should be stated that it is possible to reverse the material composition of the fins in the n-FET region and the p-FET region, i.e. Silicon-Germanium fins for the former and Silicon fins for the latter. This does not depart from the teachings and steps described above.

Thus, by having the material necessary to form both of the plurality of fins in the n-FET region 15 and the plurality of fins in the p-FET region 20 on the bulk substrate 10 at the same time, distinct advantages are obtained over prior art techniques. For example, by having the Silicon material 15 surrounding the Silicon Germanium material, you can have taller fins with higher Germanium concentration. Specifically, "tall" means you can have Silicon-Germanium fins that are around 50 nm in height or exceed 50 nm in height. This includes fins between 50 nm-60 nm in height. A "high Germanium concentration" means a Germanium concentration that is around 25%. This includes a Germanium concentration that is greater than or equal to 25% Germanium. Thus, it is possible to have fins that are greater than or equal to 50 nm in height with a Germanium concentration greater than or equal to 25%. Prior art techniques cannot achieve this result because they involve cutting the Silicon-Germanium fins with higher Germanium concentrations due to problems imposed by critical thickness and/or critical volume, which decreases as the percentage of Germanium increases.

The present teachings will alleviate the problems imposed by the decreasing critical thickness and/or critical volume as a general model because the Silicon material holds the Silicon-Germanium in place. However, the teachings herein can have increased benefit for smaller dimensions. In one particular embodiment, where the fin spacing between each fin of the plurality of Silicon fins 15, and the material forming the same, and/or each fin of the plurality of Silicon-Germanium fins 20 is between 10 nm-20 nm, and more particularly less than or equal to 10 nm, and with a fin pitch of the Silicon fins 15 and/or the Silicon-Germanium fins 20 being between 20 nm-40 nm, and more particularly for a fin pitch less than or equal to 20 nm, i.e. 20 nm, 16 nm, etc., and with the fin width being less than or equal to 10 nm, i.e. 10 nm, 8 nm, etc., a critical advantage is offered over the prior art in that the tightness of the spacing for these dimensions has the capacity to even further hold the Silicon-Germanium in place in the context of tall fins with high Germanium concentration. Moreover, with respect to the Silicon fins 15, the aforementioned dimensions have the inherent advantage of having fully-depleted Silicon fins, and all of the advantages associated therewith, while also permitting the benefits outlined above.

Figure 7:
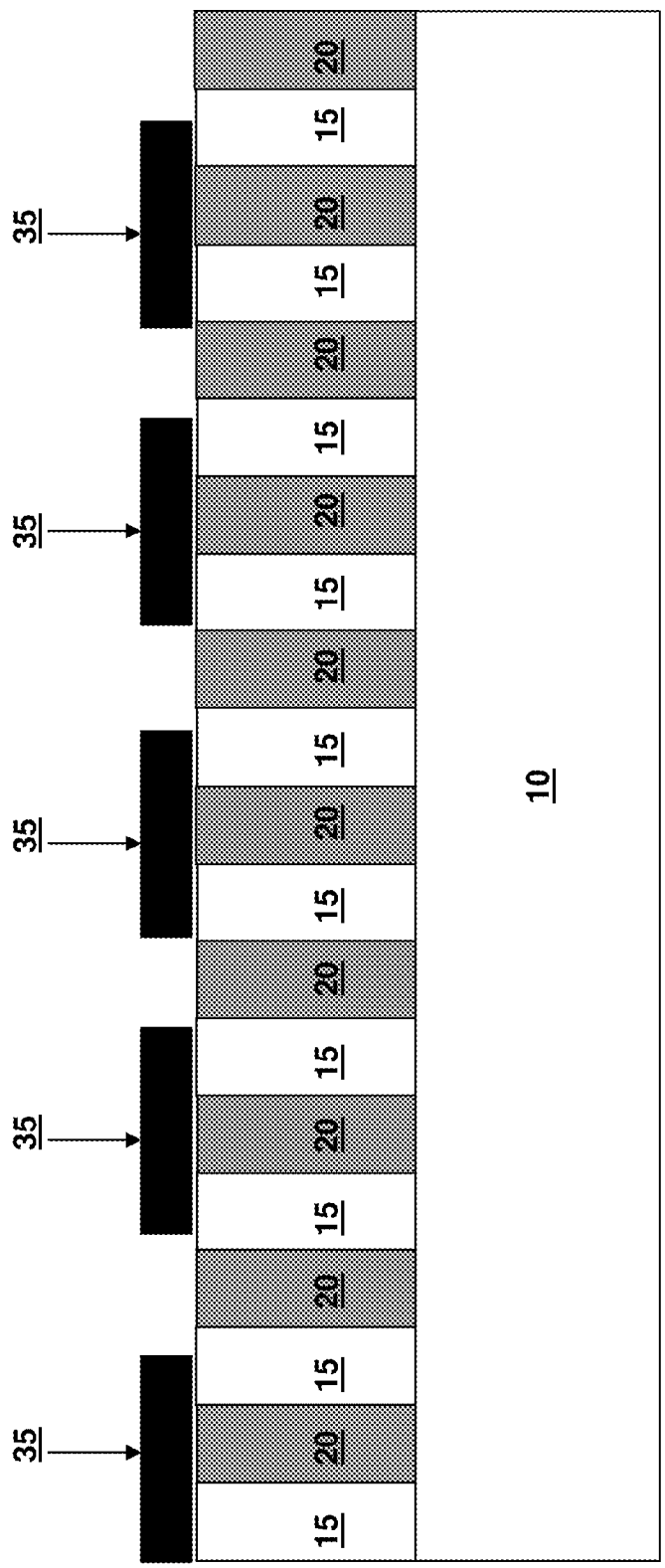
FIG. 7 illustrates a semiconductor structure in accordance with an embodiment of the present invention.
Figure 8:
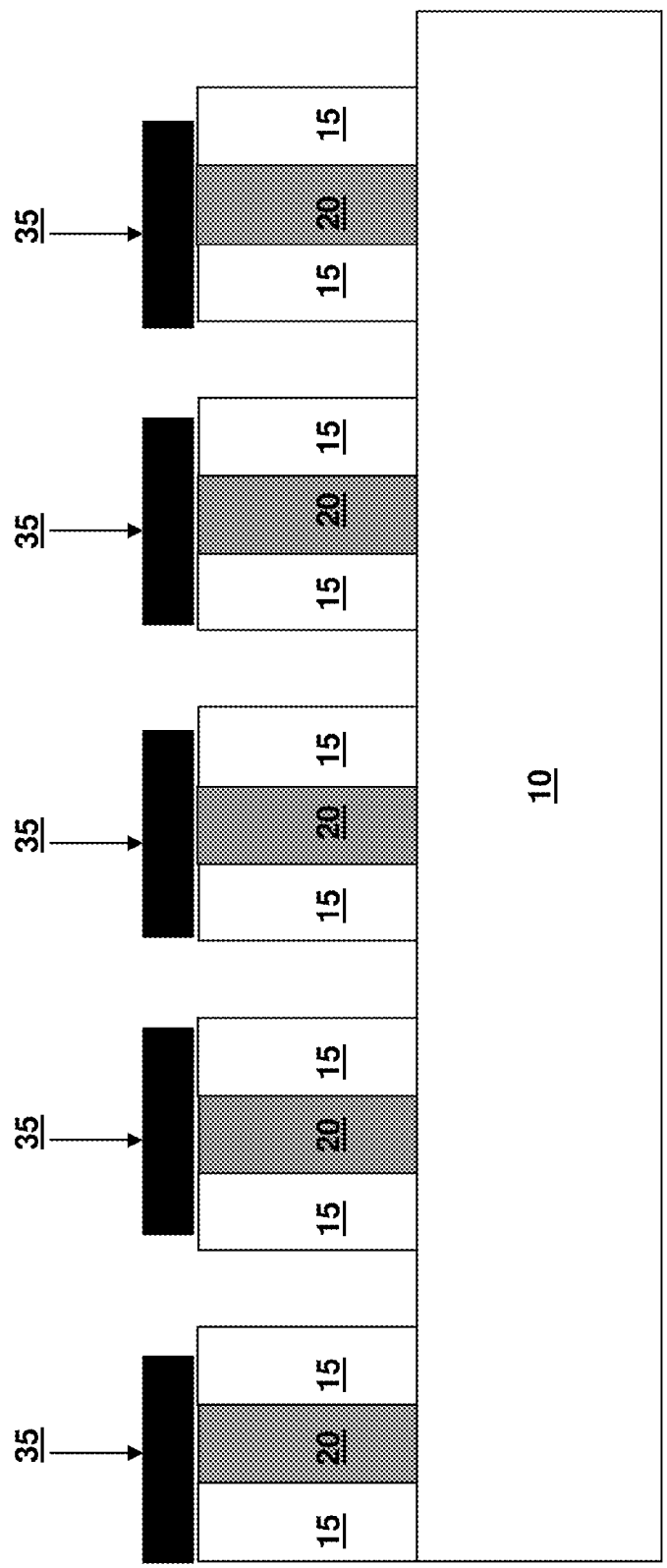
FIG. 8 illustrates a semiconductor structure in accordance with an embodiment of the present invention.

Referring now to FIG. 7, another embodiment of the present disclosure is shown. At least one hard-mask 35 is applied to the structure of FIG. 2 for the section of the bulk substrate 10 associated with a p-FET region. The purpose of the hard-mask 35 is to modify, i.e. relax or increase, the pitch between the resultant plurality of Silicon-Germanium fins 20 associated with the p-FET region of the device. A hard-mask 35 is placed over every other one of the material that will form the plurality of Silicon-Germanium fins 20. Furthermore, as shown, the hard-mask 35 can cover portions of the material that can form the plurality of Silicon fins 15, which surround the covered Silicon-Germanium material 20. The exposed Silicon-Germanium material 20, i.e. the portions uncovered by the one or more hard-mask 35, as shown in FIG. 8, can be removed. The removal can be done by an selective etch process, which removes the exposed material that can form the Silicon-Germanium fins 20 but not the covered material that can form the Silicon-Germanium fins 20 nor the covered material that can form the Silicon fins 15. One example for an etchant that can used for this process is TMAH (Tetramethylammonium hydroxide). The one or more hard mask 35 can be made of silicon nitride.

Figure 9:
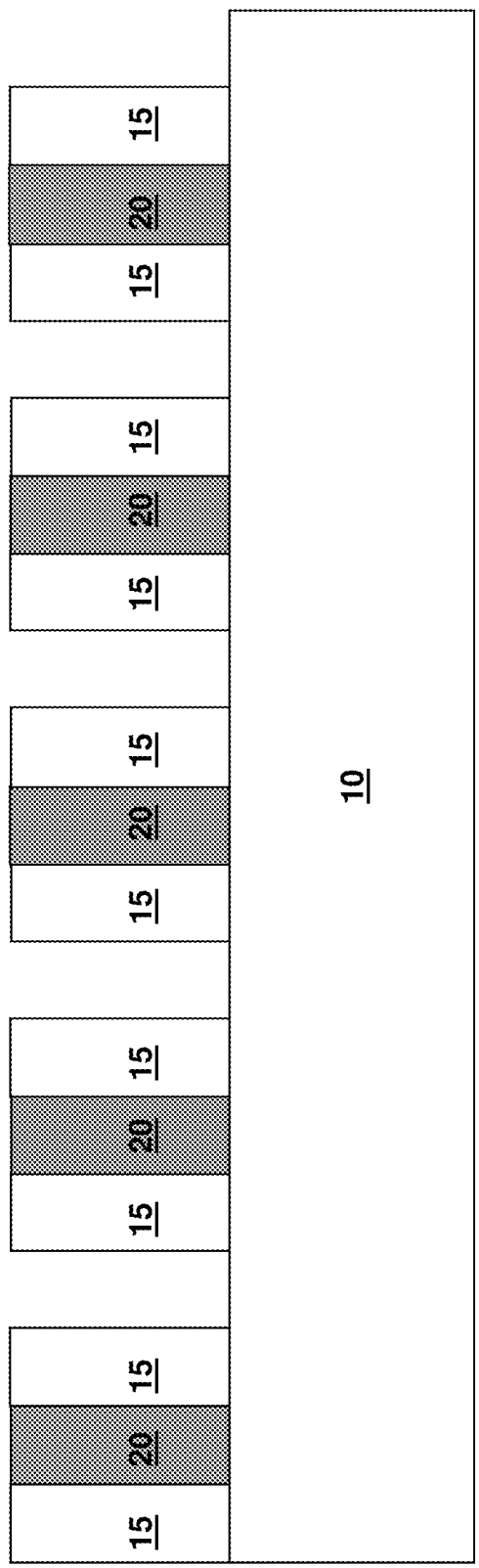
FIG. 9 illustrates a semiconductor structure in accordance with an embodiment of the present invention.
Figure 10:
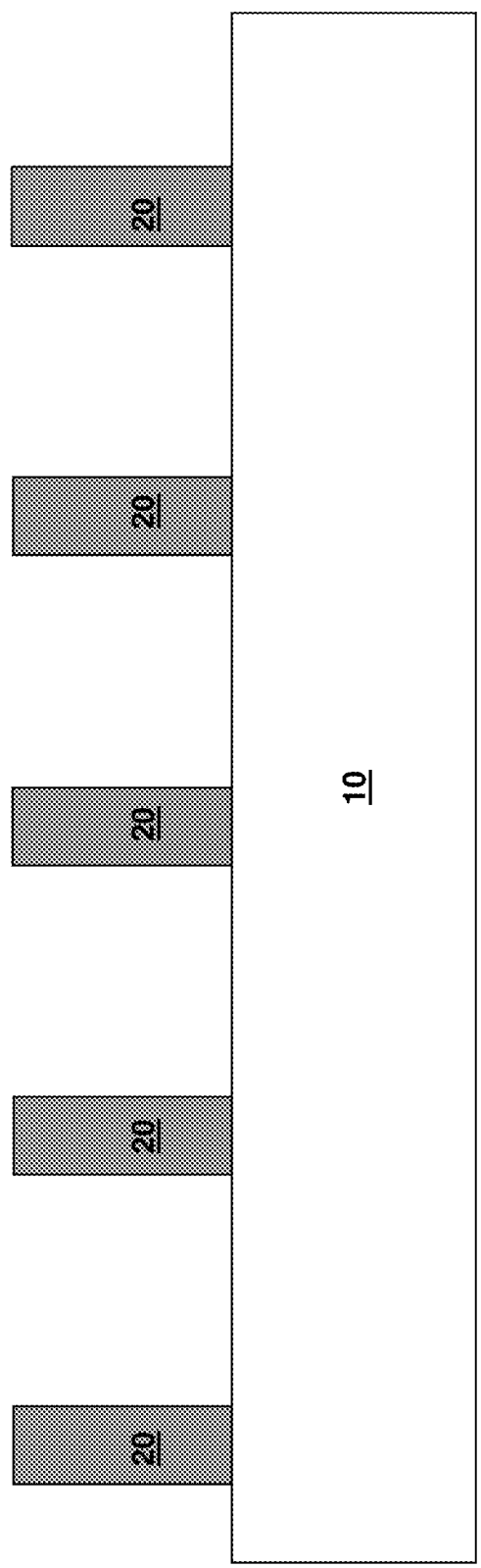
FIG. 10 illustrates a semiconductor structure in accordance with an embodiment of the present invention.

Referring now to FIG. 9, another embodiment of the present disclosure is shown. The at least one hard mask 35 is removed from each of the covered Silicon-Germanium material 20. The removal can be done by an etching process, such as a timed wet etch step. A non-limiting example for a wet etch is applying hot phosphoric acid to the hard mask. Referring to FIG. 10, the remaining Silicon material 15 that can compose the Silicon fins 15 is removed. The removal can be done by an etch process, such as a selective etch process, which removes the material that can form the Silicon fins 15 but not the material that can form the Silicon-Germanium fins 20. An example of an etchant that can enable this process is Ammonia. The result is a plurality of Silicon-Germanium fins 20 with a relaxed or increased pitch and wider spacing in between each of the Silicon-Germanium fins 20.

Thus, by having the material necessary to form both of the plurality of fins in the n-FET region 15 and the plurality of fins in the p-FET region 20 on the bulk substrate 10 at the same time, and applying the fin-pitch relaxing steps show in FIGS. 7-10, as discussed above, a distinct advantage is obtained over prior art techniques. For example, a tighter pitch can be suitable for a high performance application and a more relaxed pitch can be made for an SRAM or similar application. Since this technique does not need to be applied to both regions of a device, it is possible to have a region with a tighter pitch and a region with a more relaxed pitch, which offers an advantage in inherent flexibility.

Moreover, the advantage regarding critical thickness/critical volume, which was outlined above, remains in the present context. For example, as previously stated, by having the Silicon material 15 surrounding the Silicon Germanium material, you can have taller fins with higher Germanium concentration. Specifically, "tall" means you can have Silicon-Germanium fins that are around 50 nm in height or exceed 50 nm in height. This includes fins between 50 nm-60 nm in height. A "high Germanium concentration" means a Germanium concentration that is around 25%. A "high Germanium concentration" means a Germanium concentration that is around 25%. This includes a Germanium concentration that is greater than or equal to 25% Germanium. Thus, it is possible to have fins that are greater than or equal to 50 nm in height with a Germanium concentration greater than or equal to 25%. Prior art techniques cannot achieve this result because they involve cutting the Silicon-Germanium fins with higher Germanium concentrations due to problems imposed by critical thickness and/or critical volume, which decreases as the percentage of Germanium increases. Also, applying the pitch variation technique above provides the benefits stated, in addition to advantages that are inherent to flexibility with respect to pitch adjustment, while retaining the benefit of addressing the critical thickness/critical volume problem.

As stated, the present teachings will alleviate the problems imposed by the decreasing critical thickness and/or critical volume as a general model because the Silicon material holds the Silicon-Germanium in place; and if applied, the pitch adjustment techniques offer additional advantages, such as advantages that are inherent in more flexibility with respect to pitch adjustment. However, the teachings herein can have increased benefit for smaller dimensions. In one particular embodiment, where the fin spacing between each fin of the plurality of Silicon fins 15 and/or each fin of the plurality of Silicon-Germanium fins 20 is between 10 nm-20 nm, and more particularly less than or equal to 10 nm, and with a fin pitch of the Silicon fins 15 and/or the Silicon-Germanium fins 20 being between 20 nm-40 nm, and more particularly for a fin pitch less than or equal to 20 nm, i.e. 20 nm, 16 nm, etc., and with the fin width being less than or equal to 10 nm, i.e. 10 nm, 8 nm, etc., a critical advantage is offered over the prior art in that the tightness of the spacing for these dimensions has the capacity to even further hold the Silicon-Germanium in place in the context of tall fins with high Germanium concentration. Moreover, with respect to the Silicon fins 15, whose associated fin-adjustment steps are discussed below, the aforementioned dimensions have the inherent advantage of having fully-depleted Silicon fins, and all of the advantages associated therewith, while also permitting the benefits outlined above.

It should be further stated that since the Silicon-Germanium fins can be formed prior to fin-adjustment, when a tight fin-pitch is required, i.e. 20 nm for 10 nm wide fins with a 10 nm spacing, the benefit of enabling a taller fin with higher Germanium concentration will not be compromised because the Silicon-Germanium fin formation occurs prior to pitch adjustment. For example, a resulting adjusted fin pitch of 40 nm could have been preceded by a 20 nm pitch, prior to adjustment, where the Silicon-Germanium fins could have been formed when the pitch was 20 nm, (again, prior to adjustment).

It should be further noted that the above description shows that the method described above permits adjusting a fin-pitch associated with fins in a particular region in a FinFET device. Moreover, the above description shows that same-fin pitch and fin spacing is preserved for the resulting Silicon-Germanium fins 20 because the spacing between the plurality of Silicon-Germanium fins 20 is unaffected by removing the Silicon material 15. Although the above example is for Silicon-Germanium fins 20 of a p-FET region, the techniques described herein can apply to other regions of a FinFET.

Figure 11:
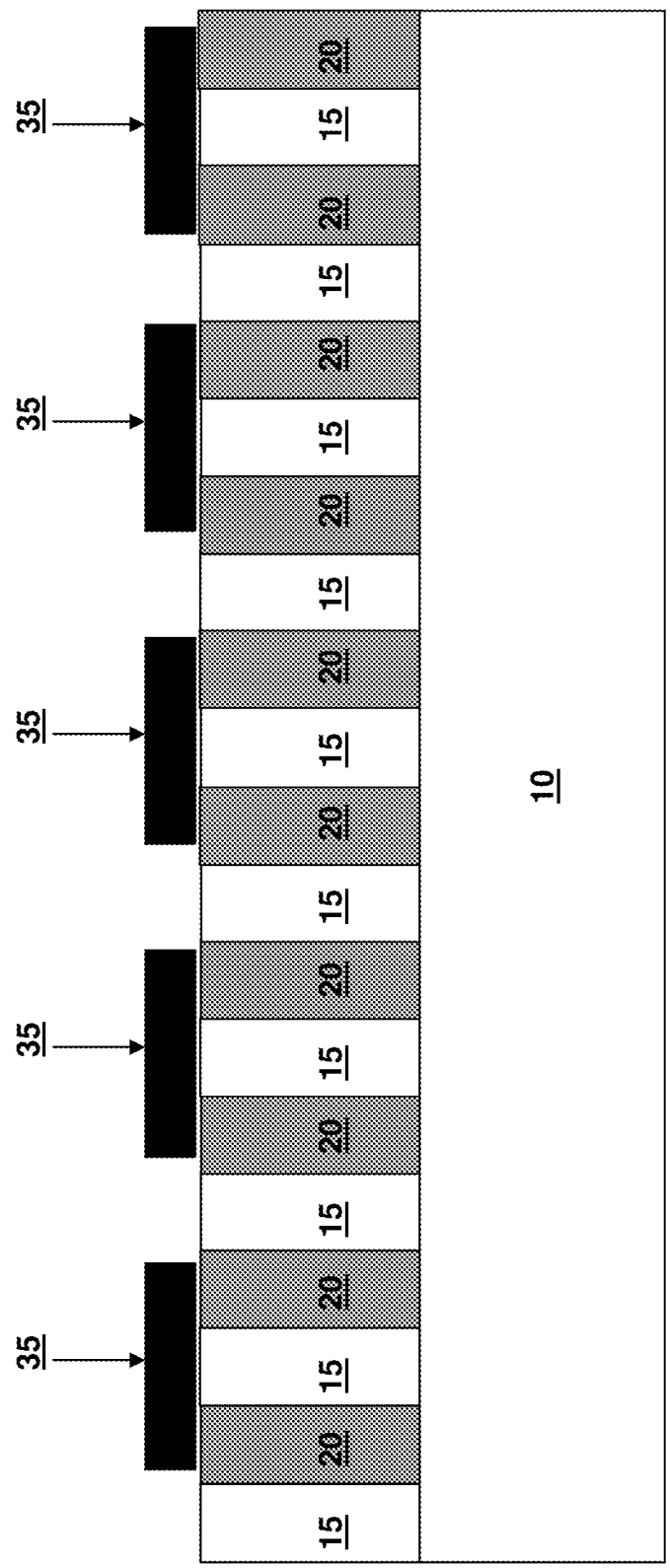
FIG. 11 illustrates a semiconductor structure in accordance with an embodiment of the present invention.
Figure 12:
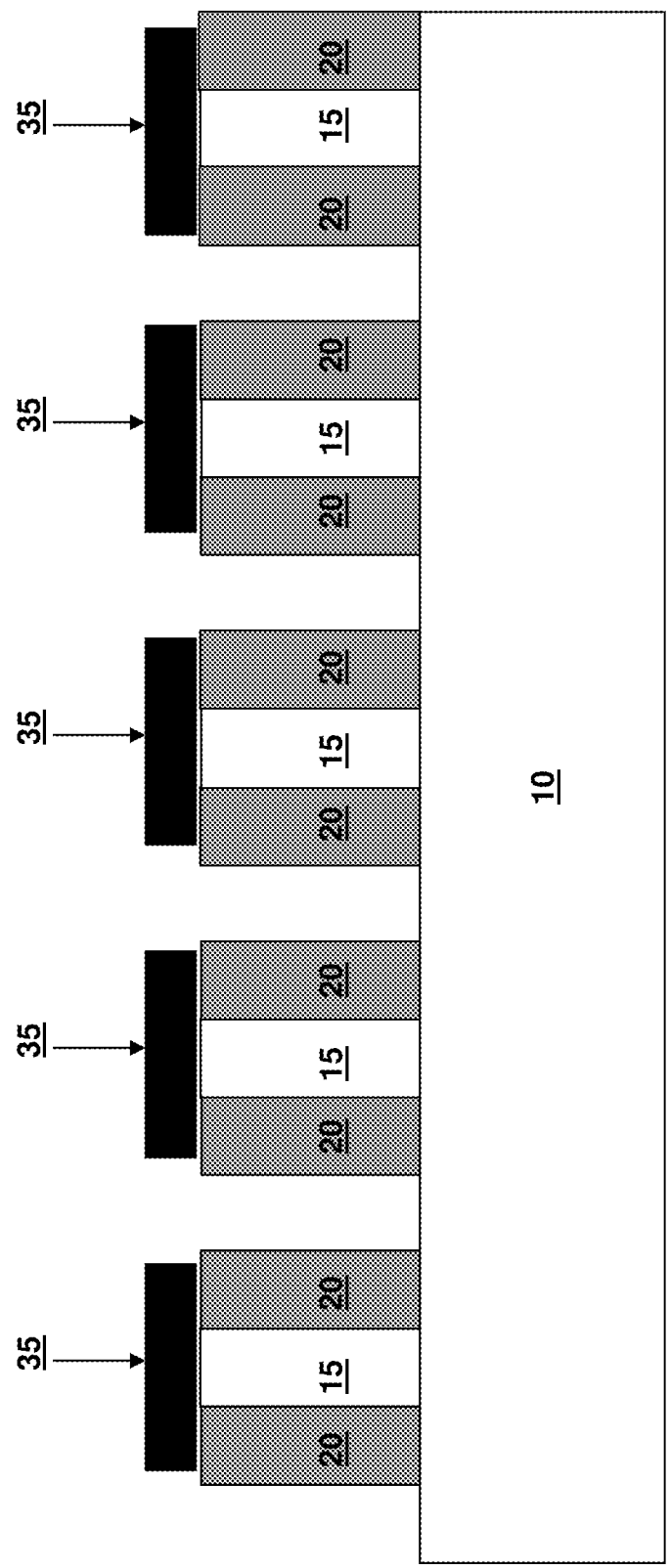
FIG. 12 illustrates a semiconductor structure in accordance with an embodiment of the present invention.

Referring now to FIG. 11, another embodiment of the present disclosure is shown. At least one hard-mask 35 is applied to the structure of FIG. 2 for the section of the bulk substrate 10 associated with a n-FET region. The purpose of the hard-mask 35 is to modify, i.e. relax or increase, the pitch between the resultant plurality of Silicon fins 15 associated with the n-FET region of the device. A hard-mask 35 is placed over every other one of the material that can form the plurality of Silicon fins 15. Furthermore, as shown, the hard-mask 35 can cover portions of the material that can form the plurality of Silicon-Germanium fins 20, which surround the covered Silicon material 15. The exposed Silicon material 15, i.e. the portions uncovered by the one or more hard-mask 35, as shown in FIG. 12, can be removed. The removal can be done by an etch process, such as a selective etch process, which removes the uncovered material that can form the Silicon fins 15 but not the covered material that can form the Silicon fins 15 nor the covered material that can form the Silicon-Germanium fins 20. An example of an etchant that can enable this process is Ammonia. The one or more hard mask 35 can be made of silicon nitride.

Figure 13:
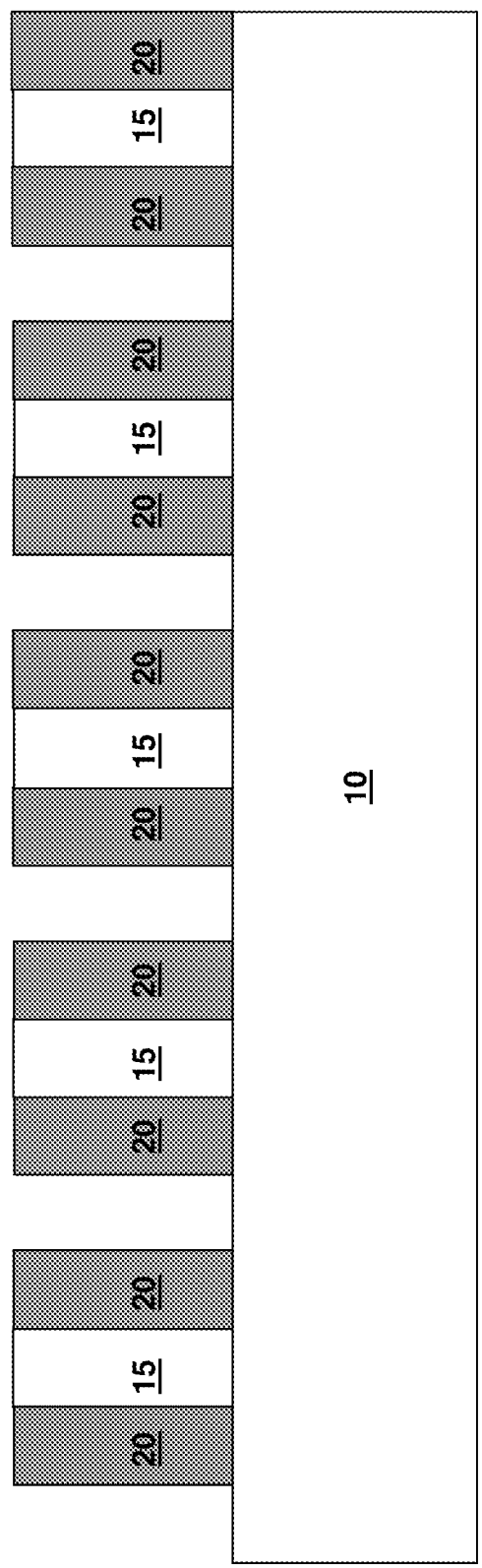
FIG. 13 illustrates a semiconductor structure in accordance with an embodiment of the present invention.
Figure 14:
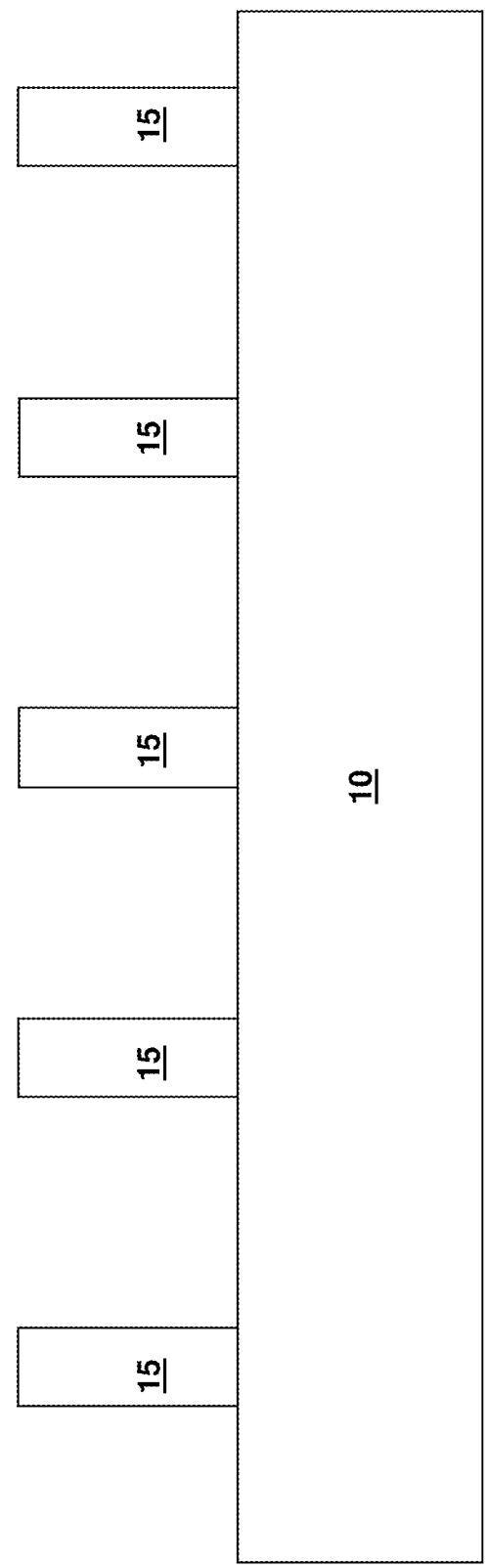
FIG. 14 illustrates a semiconductor structure in accordance with an embodiment of the present invention.

Referring now to FIG. 13, another embodiment of the present disclosure is shown. The at least one hard mask 35 is removed from each of the covered Silicon material 15. The removal can be done by an etching process, such as a timed wet etch step. A non-limiting example for a wet etch is applying hot phosphoric acid to the hard mask. Referring to FIG. 14, the remaining Silicon-Germanium material 20 is removed. The removal can be done by a selective etch process, which removes the material that can form Silicon-Germanium fins 20 but not the material that can form the Silicon fins 15. One example for an etchant that can used for this process is TMAH (Tetramethylammonium hydroxide). The result is a plurality of Silicon fins 15 with a relaxed pitch and spacing in between each of the Silicon fins 15.

Thus, by having the material necessary to form both of the plurality of fins in the n-FET region 15 and the plurality of fins in the p-FET region 20 on the bulk substrate 10 at the same time, and applying the fin-pitch adjustment steps show in FIGS. 11-14, as discussed above, a distinct advantage is obtained over prior art techniques. Specifically, applying the fin-adjustment techniques to the n-FET region, the p-FET region, or both, as stated, can, for example, provide a tighter pitch be suitable for a high performance application and a more relaxed pitch can be made for an SRAM or similar application. Since this technique does not need to be applied to both regions of a device, it is possible to have a region with a tighter pitch and a region with a more relaxed pitch, which offers an advantage in inherent flexibility.

Moreover, as stated, there are advantages inherent to being able to adjust fin-pitch in a given region. Additionally, developing the n-FET region, with or without the fin pitch adjustment techniques, addresses the issue with the Silicon-Germanium fins 20 while also permitting the Silicon-fins 15 to be developed for the n-fet region. Thus, the fin-adjustment technique can be applied to the n-FET region in a manner that does not eliminate the ability to address the critical thickness/critical volume problem associated with the Silicon-Germanium fins, while also being able to form Silicon fins for an n-FET region.

As stated with discussion to fin-adjustment of the p-FET region, the dimensions can be such that the fin spacing between each fin of the plurality of Silicon fins 15 and/or each fin of the plurality of Silicon-Germanium fins 20 is between 10 nm-20 nm, and more particularly less than or equal to 10 nm, and with a fin pitch of the Silicon fins 15 and/or the Silicon-Germanium fins 20 being between 20 nm-40 nm, and more particularly for a fin pitch less than or equal to 20 nm, i.e. 20 nm, 16 nm, etc., and with the fin width being less than or equal to 10 nm, i.e. 10 nm, 8 nm, etc. As also stated, with respect to the Silicon fins 15, the aforementioned dimensions have the inherent advantage of having fully-depleted Silicon fins, and all of the advantages associated therewith, while also permitting the benefits outlined above.

It should be noted that the above description shows that the method described above permits adjusting a fin-pitch associated with fins in a particular region in a FinFET device. Although the above example is for Silicon fins 15 of an n-FET region, the techniques described herein can apply to other regions of a FinFET.

Finally, as implied, in one embodiment of the present disclosure, it is possible to apply the pitch-relaxing/increasing techniques described in FIGS. 7-14 to only one region, i.e. for example, the steps described for FIGS. 7-10 for the p-FET region without performing the steps described for FIGS. 11-14 for the n-FET region, or visa versa. The result will be that for fins in a given region the fin pitch and fin spacing will be the same, but the fin pitch and fin spacing of that given region will be different from that of the other region, i.e., for example, one region can have a fin spacing of 10 nm and a fin pitch of 20 nm, and the other region can have a fin spacing of 20 nm and a fin pitch of 40 nm. As stated, this is beneficial because the benefit of addressing the critical thickness/critical volume issue remains intact, while also offering advantages that are inherent in being able to adjust fin pitch in one region and not the other, such as having, on the same device, a high performance region with a tight pitch and an SRAM region with a more relaxed pitch.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
    a first region on a substrate;
    a second region on the substrate;
    a plurality of Silicon fins, with a uniform fin pitch, in the first region of the substrate, the plurality of Silicon fins each having a width less than or equal to 10 nm, and the uniform fin pitch of the plurality of Silicon fins is equal to a width of one silicon fin plus a width of one silicon-germanium fin; and
    a plurality of Silicon-Germanium fins, with a uniform fin pitch, in the second region of the substrate, the plurality of Silicon-Germanium fins each having a width less than or equal to 10 nm, and the uniform fin pitch of the plurality of Silicon-Germanium fins is equal to the width of one silicon-germanium fin plus the width of one silicon fin, and wherein the Silicon-Germanium fins are at least 50 nm tall and have Germanium concentration of at least 25% Germanium.

2. The structure according to claim 1, wherein the uniform Silicon fin pitch is different than the same Silicon-Germanium fin pitch.

3. The structure according to claim 1, wherein the uniform fin pitch of the Silicon fins is less than or equal to 20 nm, and the uniform fin pitch of the Silicon-Germanium fins is less than or equal to 20 nm.

4. The structure according to claim 1, wherein both the uniform Silicon-Germanium fin pitch and the uniform Silicon fin pitch are 20 nm.

5. The structure according to claim 1, wherein at least two fins of the plurality of Silicon-Germanium fins have a different concentration of Ge.

6. The structure according to claim 1, wherein the first region is a p-FET region and the second region is an n-FET region, wherein the fin spacing between plurality of Silicon fins in the first region and between the plurality of Silicon-germanium fins in the second region is 10 nm, wherein the fin-pitch of the plurality of Silicon fins in the first region and between the plurality of Silicon-germanium fins in the second region is 20 nm, and wherein a width of the plurality of Silicon fins in the first region and a width of the plurality of Silicon-germanium fins in the second region is 10 nm.

7. The structure according to claim 1, wherein the first region is an n-FET region and the second region is a p-FET region.

8. The structure according to claim 1, wherein the fin pitch of the silicon germanium fins is less than or equal to 20 nm.

9. A structure comprising:
    a plurality of silicon fins in a NFET region of a substrate, the plurality of silicon fins having a width less than or equal to 10 nm and a fin pitch less than or equal to 20 nm; and
    a plurality of silicon-germanium fins in a PFET region of the substrate, the plurality of silicon-germanium fins being at least 50 nm high and having a germanium concentration of at least 25%,
    wherein the fin pitch of the silicon fins is equal to a width of one silicon fin plus a width of one silicon-germanium fin, and
    wherein the fin pitch of the silicon-germanium fins is equal to two times the width of one silicon fin plus a width of one silicon-germanium fin.

10. The structure according to claim 9, wherein a width of the plurality of silicon-germanium fins is substantially equal to the width of the plurality of silicon fins.

11. The structure according to claim 9, wherein at least two fins of the plurality of Silicon-Germanium fins have a different concentration of Ge.

12. The structure according to claim 9, wherein the fin pitch of the Silicon fins is 20 nm, and the fin pitch of the Silicon-Germanium fins is 40 nm.

13. The structure according to claim 9, wherein the fin pitch of the silicon fins is less than or equal to 20 nm.

14. A structure comprising:
a plurality of silicon fins in a NFET region of a substrate, the plurality of silicon fins having a width less than or equal to 10 nm and a fin pitch less than or equal to 20 nm; and
a plurality of silicon-germanium fins in a PFET region of the substrate, the plurality of silicon-germanium fins being at least 50 nm high and having a germanium concentration of at least 25%,
wherein the fin pitch of the silicon-germanium fins is equal to a width of one silicon-germanium fin plus a width of one silicon fin, and
wherein the fin pitch of the silicon fins is equal to two times the width of one silicon-germanium fin plus a width of one silicon fin.

15. The structure according to claim 14, wherein a width of the plurality of silicon-germanium fins is substantially equal to the width of the plurality of silicon fins.

16. The structure according to claim 14, wherein at least two fins of the plurality of Silicon-Germanium fins have a different concentration of Ge.

17. The structure according to claim 14, wherein the fin pitch of the Silicon fins is 40 nm, and the fin pitch of the Silicon-Germanium fins is 20 nm.

* * * * *